United States Patent
Xu et al.

(10) Patent No.: US 9,997,560 B2
(45) Date of Patent: Jun. 12, 2018

(54) DISPLAY SUBSTRATE, METHOD FOR FABRICATING THE SAME AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Yubo Xu, Beijing (CN); Ming Hu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 81 days.

(21) Appl. No.: 14/431,504

(22) PCT Filed: Jul. 3, 2014

(86) PCT No.: PCT/CN2014/081580
§ 371 (c)(1),
(2) Date: Mar. 26, 2015

(87) PCT Pub. No.: WO2015/113375
PCT Pub. Date: Aug. 6, 2015

(65) Prior Publication Data
US 2016/0027841 A1    Jan. 28, 2016

(30) Foreign Application Priority Data

Jan. 29, 2014   (CN) .......................... 2014 1 0043962

(51) Int. Cl.
*H01L 27/15* (2006.01)
*H01L 27/12* (2006.01)
*G02F 1/1343* (2006.01)

(52) U.S. Cl.
CPC ...... *H01L 27/156* (2013.01); *G02F 1/134309* (2013.01); *H01L 27/124* (2013.01);
(Continued)

(58) Field of Classification Search
CPC ............ H01L 27/3216; H01L 27/3213; H01L 27/313; H01L 27/3218
See application file for complete search history.

(56) References Cited

U.S. PATENT DOCUMENTS

2010/0284052 A1\* 11/2010 Hsiao .................... G02B 5/201
                                                                 359/259
2012/0299947 A1\* 11/2012 Tsuda ....................... G09G 3/20
                                                                 345/589

(Continued)

FOREIGN PATENT DOCUMENTS

CN         101349845 A      1/2009
CN         103792723 A      5/2014
(Continued)

OTHER PUBLICATIONS

International Search Report Appln. No. PCT/CN2014/081580; dated Nov. 3, 2014.

(Continued)

*Primary Examiner* — Daniel Whalen
*Assistant Examiner* — Suberr Chi
(74) *Attorney, Agent, or Firm* — Ladas & Parry LLP

(57) ABSTRACT

A display substrate, a method for fabricating the same and a display device are disclosed. The display substrate includes: a base substrate and a plurality of pixel sets disposed on the base substrate, each of the pixel sets (Continued)

comprising: four first sub-pixels (21), four second sub-pixels (22), four third sub-pixels (23) and four fourth sub-pixels (24), sub-pixels of each of the pixel-sets are arranged into a 4×4 matrix; among four pixel rows of each of the pixel sets, a first sub-pixel (21), a second sub-pixel (22), a third sub-pixel (23) and a fourth sub-pixel (24) are sequentially arranged in one of the pixel rows, a second sub-pixel (22), a third sub-pixel (23), a fourth sub-pixel (24) and a first sub-pixel (21) are sequentially arranged in one of the pixel rows, a fourth sub-pixel (24), a first sub-pixel (21), a second sub-pixel (22) and a third sub-pixel (23) are sequentially arranged in one of the pixel rows, and a third sub-pixel (23), a fourth sub-pixel (24), a first sub-pixel (21) and a second sub-pixel (22) are sequentially arranged in one of the pixel rows. The display substrate improves the display quality of the displayed images.

19 Claims, 4 Drawing Sheets

(52) U.S. Cl.
CPC ............... *H01L 27/1259* (2013.01); *G02F 2001/134345* (2013.01); *G02F 2201/52* (2013.01)

(56) References Cited

U.S. PATENT DOCUMENTS

| 2014/0104301 A1 | 3/2014 | Nakagawa et al. |
| 2015/0109697 A1 | 4/2015 | Nagase et al. |

FOREIGN PATENT DOCUMENTS

| CN | 103792724 A | 5/2014 | |
| CN | 103792725 A | 5/2014 | |
| KR | 101035924 B1 * | 5/2011 | ........... G02F 1/1335 |
| KR | 101035924 B1 | 5/2011 | |
| KR | 101067555 B1 | 9/2011 | |
| WO | 2012176800 A1 | 12/2012 | |
| WO | 2013191082 A1 | 12/2013 | |

OTHER PUBLICATIONS

Written Opinion of the International Searching Authority Appln. No. PCT/CN2014/081580; dated Nov. 3, 2014.

First Chinese Office Action Appln. No. 201410043962.5; dated Nov. 6, 2015.

* cited by examiner

DISPLAY SUBSTRATE, METHOD FOR FABRICATING THE SAME AND DISPLAY DEVICE

FIELD OF THE ART

Embodiments of the invention relate to a display substrate, a method for fabricating the same and a display device.

BACKGROUND

Liquid Crystal Displays (LCDs) are currently the most popular flat panel displays, among which Thin Film Transistor Liquid Crystal Displays (TFT-LCDs) are mainstream LCD products. A display device is an important component of a LCD. A display device is formed through cell-assembling an array substrate and a color filter substrate, and a liquid crystal layer is filled in-between the array substrate and the color filter substrate.

FIG. 1 schematically illustrates a configuration of a known color filter substrate. As illustrated in FIG. 1, the array substrate comprises: a black matrix 10, and red sub-pixels 11, green sub-pixels 12, blue sub-pixels 13 and white sub-pixels 14 which are arranged regularly. The sub-pixels on the color filter substrate of FIG. 1 make use of a traditional RGBW arrangement to display pictures on the display device.

SUMMARY

A first aspect of the invention provides a display substrate, comprising: a base substrate and a plurality of pixel sets disposed on the base substrate, each of the pixel sets comprises: four first sub-pixels, four second sub-pixels, four third sub-pixels and four fourth sub-pixels, wherein sub-pixels of each of the pixel-sets are arranged into a 4×4 matrix; among four pixel rows of each of the pixel sets, a first sub-pixel, a second sub-pixel, a third sub-pixel and a fourth sub-pixel are sequentially arranged in one of the pixel rows, a second sub-pixel, a third sub-pixel, a fourth sub-pixel and a first sub-pixel are sequentially arranged in one of the pixel rows, a fourth sub-pixel, a first sub-pixel, a second sub-pixel and a third sub-pixel are sequentially arranged in one of the pixel rows, and a third sub-pixel, a fourth sub-pixel, a first sub-pixel and a second sub-pixel are sequentially arranged in one of the pixel rows.

As an example, the sequentially arranged first sub-pixel, second sub-pixel, third sub-pixel and fourth sub-pixel are located in a first pixel row, the sequentially arranged second sub-pixel, third sub-pixel, fourth sub-pixel and first sub-pixel are located in a second pixel row, the sequentially arranged fourth sub-pixel, first sub-pixel, second sub-pixel, and third sub-pixel are located in a third pixel row, and the sequentially arranged third sub-pixel, fourth sub-pixel, first sub-pixel and second sub-pixel are located in a fourth pixel row; or the sequentially arranged first sub-pixel, second sub-pixel, third sub-pixel and fourth sub-pixel are located in a first pixel row, the sequentially arranged third sub-pixel, fourth sub-pixel, first sub-pixel and second sub-pixel are located in a second pixel row, the sequentially arranged fourth sub-pixel, first sub-pixel, second sub-pixel, and third sub-pixel are located in a third pixel row, and the sequentially arranged second sub-pixel, third sub-pixel, fourth sub-pixel and first sub-pixel are located in a fourth pixel row.

As an example, a white light-transmissive region is disposed in at least one of the first sub-pixel, the second sub-pixel and the third sub-pixel.

As an example, the white light-transmissive region is disposed in all of the first and second sub-pixels.

As an example, the white light-transmissive region is disposed in the first and second sub-pixels, and projections along a direction of pixel rows of the white light-transmissive regions disposed in adjacent first and second sub-pixels do not overlap each other.

As an example, the white light-transmissive region is disposed in the second and third sub-pixels, and projections along a direction of pixel rows of the white light-transmissive regions disposed in adjacent second and third sub-pixels do not overlap each other.

As an example, the white light-transmissive region is disposed in all of the second sub-pixels.

As an example, the display substrate comprises eight pixel sets arranged into a 2×4 matrix, wherein two adjacent pixel sets form one region, and a white light-transmissive region is disposed in all of the first and second sub-pixels in two regions arranged along a diagonal line of the matrix.

As an example, the white light-transmissive region is a strip-shaped region obliquely disposed with respect to a direction of pixel rows.

As an example, the white light-transmissive region is a strip-shaped region disposed parallel to a direction of pixel rows.

As an example, a length of the white light-transmissive region along the direction of pixel rows is larger than 0 and smaller or equal to one-third of a length of the sub-pixel along the direction of pixel rows.

As an example, the first sub-pixel is a red sub-pixel, the second sub-pixel is a blue sub-pixel, the third sub-pixel is a green sub-pixel, and the fourth sub-pixel is a white sub-pixel.

A second aspect of the invention provides a display device comprising any of the above array substrates.

As an example, the display device further comprises an opposed substrate, wherein the display substrate is a color filter substrate and the opposed substrate is an array substrate.

A third aspect of the invention provides a method for fabricating a display substrate, comprising:

forming a plurality of pixel sets on a base substrate, wherein each of the pixel sets comprises: four first sub-pixels, four second sub-pixels, four third sub-pixels and four fourth sub-pixels, sub-pixels of each of the pixel-sets are arranged into a 4×4 matrix; among four pixel rows of each of the pixel sets, a first sub-pixel, a second sub-pixel, a third sub-pixel and a fourth sub-pixel are sequentially arranged in one of the pixel rows, a second sub-pixel, a third sub-pixel, a fourth sub-pixel and a first sub-pixel are sequentially arranged in one of the pixel rows, a fourth sub-pixel, a first sub-pixel, a second sub-pixel and a third sub-pixel are sequentially arranged in one of the pixel rows, and a third sub-pixel, a fourth sub-pixel, a first sub-pixel and a second sub-pixel are sequentially arranged in one of the pixel rows.

As an example, the method further comprises a white light-transmissive region in at least one of the first sub-pixel, the second sub-pixel and the third sub-pixel.

As an example, the white light-transmissive region is a strip-shaped region obliquely disposed with respect to a direction of pixel rows.

As an example, the white light-transmissive region is a strip-shaped region disposed parallel to a direction of pixel rows.

As an example, the first sub-pixel is a red sub-pixel, the second sub-pixel is a blue sub-pixel, the third sub-pixel is a green sub-pixel, and the fourth sub-pixel is a white sub-pixel.

As an example, the method further comprises forming black matrix surrounding each of the sub-pixels on the base substrate.

BRIEF DESCRIPTION OF THE DRAWINGS

In order to clearly illustrate the technical solution of the embodiments of the invention, the drawings of the embodiments will be briefly described in the following. It is obvious that the described drawings are only related to some embodiments of the invention and thus are not limitative of the invention.

DETAILED DESCRIPTION

Figure 1:
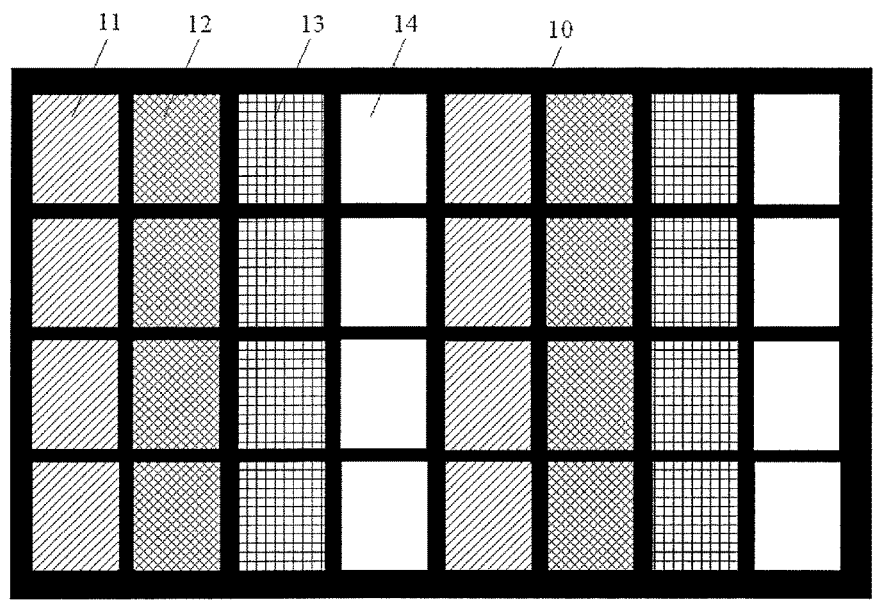
FIG. 1 schematically illustrates a configuration of a known color filter substrate.

The white sub-pixels 14 of FIG. 1 are over densely arranged, that is, the white sub-pixels 14 are in the same column, which will cause severe white streaks in gray-scale images on the display device, thereby degrading the display quality of the displayed images.

Embodiments of the invention provide a display substrate, a method for fabricating the same, with an objective of improving the display quality of the displayed images.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 2:
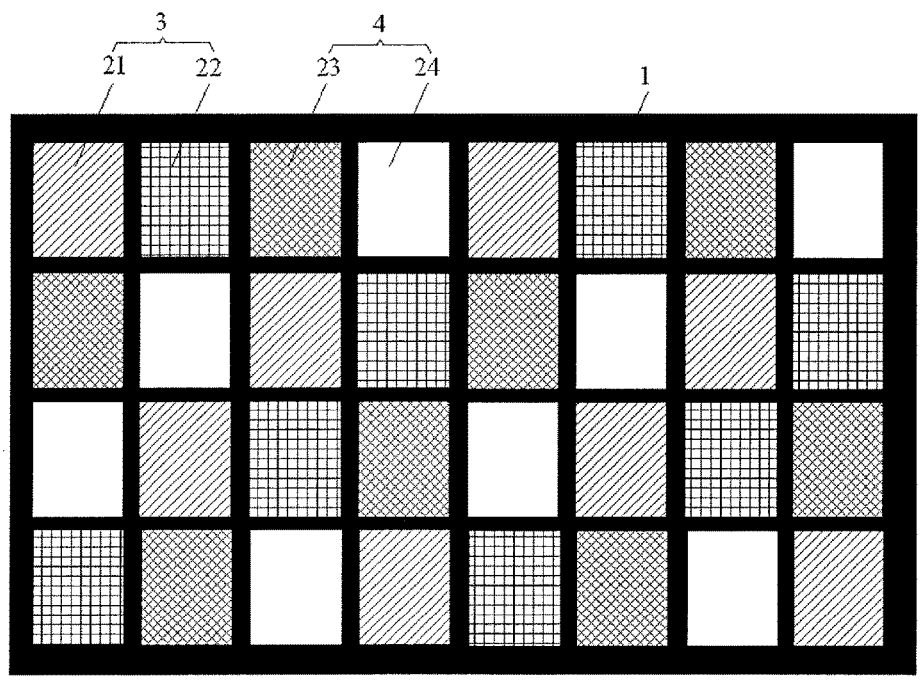
FIG. 2 schematically illustrates a configuration of a display substrate in accordance with a first embodiment of the invention.

FIG. 2 schematically illustrates a configuration of a display substrate provided by a first embodiment of the invention. As illustrated in FIG. 2, the display device comprises: a base substrate and a plurality of pixel sets disposed on the base substrate, each of the pixel sets comprising: four first sub-pixels 21, four second sub-pixels 22, four third sub-pixels 23 and four fourth sub-pixels 24, wherein sub-pixels of each of the pixel-sets are arranged into a 4×4 matrix (i.e., 4 rows by 4 columns). Among the four pixel rows of each of the pixel sets, the first sub-pixel 21, the second sub-pixel 22, the third sub-pixel 23 and the fourth sub-pixel 24 are sequentially arranged in one of the pixel rows, the second sub-pixel 22, the third sub-pixel 23, the fourth sub-pixel 24 and the first sub-pixel 21 are sequentially arranged in one of the pixel rows, the fourth sub-pixel 24, the first sub-pixel 21, the second sub-pixel 22 and the third sub-pixel 23 are sequentially arranged in one of the pixel rows, and the third sub-pixel 23, the fourth sub-pixel 24, the first sub-pixel 21 and the second sub-pixel 22 are sequentially arranged in one of the pixel rows.

In the embodiment, the sequentially arranged first sub-pixel 21, second sub-pixel 22, third sub-pixel 23 and fourth sub-pixel 24 are located in the first pixel row, the sequentially arranged third sub-pixel 23, fourth sub-pixel 24, first sub-pixel 21 and second sub-pixel 22 are located in the second pixel row, the sequentially arranged fourth sub-pixel 24, first sub-pixel 21, second sub-pixel 22, and third sub-pixel 23 are located in the third pixel row, and the sequentially arranged second sub-pixel 22, third sub-pixel 23, fourth sub-pixel 24 and first sub-pixel 21 are located in the fourth pixel row.

As an example, the first sub-pixel 21 is a red sub-pixel, the second sub-pixel 22 is a blue sub-pixel, the third sub-pixel 23 is a green sub-pixel, and the fourth sub-pixel 24 is a white sub-pixel. In each of the pixel sets, the red sub-pixel, the blue sub-pixel, the green sub-pixel and the white sub-pixel are sequentially arranged in the first pixel row, the green sub-pixel, the white sub-pixel, the red sub-pixel and the blue sub-pixel are sequentially arranged in the second pixel row, the white sub-pixel, the red sub-pixel, the blue sub-pixel and the green sub-pixel are sequentially arranged in the third pixel row, and the blue sub-pixel, the green sub-pixel, the white sub-pixel and the red sub-pixel are sequentially arranged in the fourth pixel row.

In each pixel row, the first sub-pixel 21, the second sub-pixel 22, the third sub-pixel 23 and the fourth sub-pixel 24 form a pixel element, or any two of the four sub-pixels form a pixel element. In the embodiment, two sub-pixels of the first sub-pixel 21, the second sub-pixel 22, the third sub-pixel 23 and the fourth sub-pixel 24 of each pixel row form a pixel element. If the first sub-pixel 21 is a red sub-pixel, the second sub-pixel 22 is a blue sub-pixel, the third sub-pixel 23 is a green sub-pixel and the fourth sub-pixel 24 is a white sub-pixel, a pixel element 3 in the first pixel row comprises sequentially arranged red sub-pixel and blue sub-pixel, a pixel element 4 in the first pixel row comprises sequentially arranged green sub-pixel and white sub-pixel, a pixel element 3 in the second pixel row comprises sequentially arranged green sub-pixel and white sub-pixel, a pixel element 4 in the second pixel row comprises sequentially arranged red sub-pixel and blue sub-pixel, a pixel element 3 in the third pixel row comprises sequentially arranged white sub-pixel and red sub-pixel, a pixel element 4 in the third pixel row comprises sequentially arranged blue pixel and green pixel, a pixel element 3 in the fourth pixel row comprises sequentially arranged blue pixel and green pixel, and a pixel element 4 in the fourth pixel row comprises sequentially arranged white sub-pixel and red sub-pixel.

In the technical solution of the display substrate provided by the embodiment of the invention, the first, second, third and fourth sub-pixels of the four different pixel rows in each pixel set are sequentially arranged in different orders, such that individual sub-pixels are evenly distributed, thereby preventing the same sub-pixel from being located in the same column. Such a configuration helps to prevent serious white streaks in gray-scale pictures displayed in the display device, which in turn improves the display quality of the display device.

Figure 3:
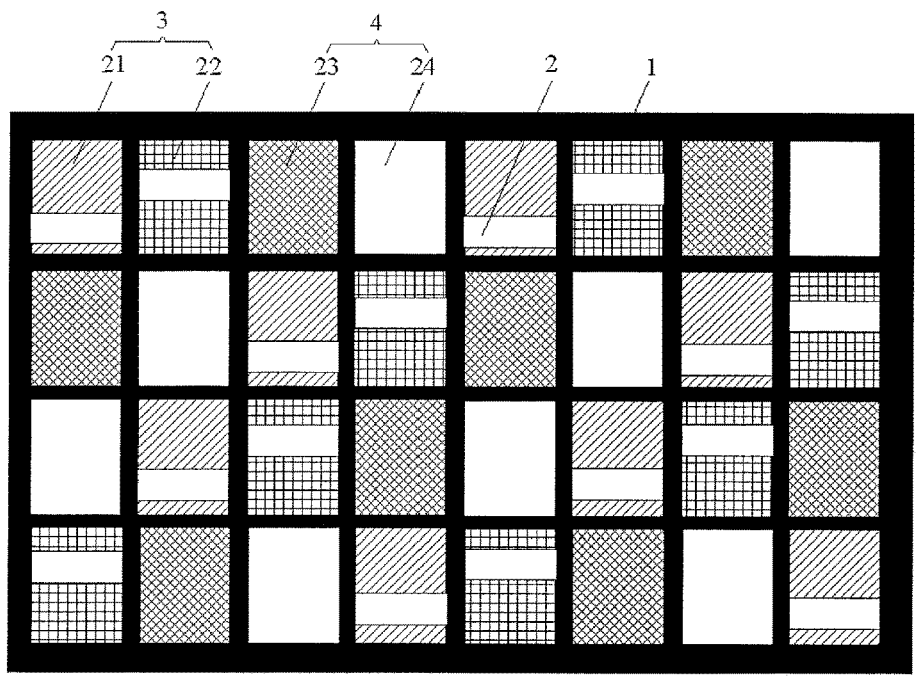
FIG. 3 schematically illustrates a configuration of a display substrate in accordance with a second embodiment of the invention.

FIG. 3 schematically illustrates a configuration of a display substrate provided by a second embodiment of the invention. As illustrated in FIG. 3, on the basis of embodiment 1, a white light-transmissive region 2 is disposed in at least one of a first sub-pixel 21, a second sub-pixel 22 and a third sub-pixel 23 in this embodiment.

As an example, the white light-transmissive region 2 is disposed in all of the first sub-pixels 21 and second sub-pixels 22.

The first sub-pixels 21 are red sub-pixel and the second sub-pixels 22 are blue sub-pixels. Therefore, in the embodiment, the white light-transmissive region 2 is disposed in all of the red and blue sub-pixels. In the above implementation, each pixel element comprises a white sub-pixel or a white light-transmissive region, such that each pixel element comprises three color elements of red, green and blue, which helps to improve the display effect of the displayed images. In the above implementation, the disposition of the white light-transmissive region(s) allows the white color to distribute more evenly, which helps to improve the transmittivity of the display substrate as well as the display effect of the displayed images, further optimizing the visual experience of the user. Human eyes are less sensitive to red and blue sub-pixels in comparison to green sub-pixels; therefore the white light-transmissive region is disposed in the red and blue sub-pixels, which can improve the transmittivity of the substrate while guaranteeing the display quality of the images.

As an example, projections along a direction of pixel rows of the white light-transmissive regions disposed in the adjacent first sub-pixel 21 and second sub-pixel 22 do not overlap each other. That is, the white light-transmissive regions 2 disposed in the adjacent first sub-pixel 21 and second sub-pixel 22 are staggered along the direction of pixel rows. As illustrated in FIG. 3, the projections along the direction of pixel rows (the horizontal direction) of the white light-transmissive regions disposed in the adjacent first sub-pixel 21 and second sub-pixel 22 do not overlap each other, preventing the white light-transmissive regions from forming continuous white light-transmissive regions along an arrangement direction of the sub-pixels, thereby preventing white horizontal streaks in the displayed images.

In the embodiment, the transmittivity of the red, green and blue sub-pixels is lower than 30%, while that of the white light-transmissive region 2 is nearly 100%. Therefore, disposing the white light-transmissive region in at least one of the red, green and blue sub-pixels can effectively improve the transmittivity of the display substrate.

Alternatively, the white light-transmissive region is disposed in pixel elements not comprising the fourth sub-pixels 24. Such a scenario will not be elaborated here.

In the embodiment, the white light-transmissive region 2 disposed in the first sub-pixel 21 is a void space within a color filter layer of the first sub-pixel 21; the white light-transmissive region 2 disposed in the second sub-pixel 22 is a void space within a color filter layer of the second sub-pixel 22; and the white light-transmissive region 2 disposed in the third sub-pixel 23 is a void space within a color filter layer of the third sub-pixel 23. In the embodiment, the white light-transmissive region 2 is a strip-shaped region disposed along the direction of pixel rows. Optionally, in practical applications, the white light-transmissive region 2 may be of other shapes. Optionally, in practical applications, the white light-transmissive region 2 may be disposed in other ways. As an example, the white light-transmissive region 2 is a strip-shaped region obliquely disposed with respect to the direction of pixel rows, which will be described in the following.

A size of the white light-transmissive region 2 may be configured as required. As an example, a length of the white light-transmissive region 2 along a direction vertical to the direction of pixel rows (that is a direction of pixel columns) is smaller or equal to one-third of a length of the color sub-pixels and larger than 0. The white light-transmissive region 2 with such a size can effectively prevent the white light-transmissive regions from forming continuous white light-transmissive regions along an arrangement direction of the sub-pixels, thereby preventing white horizontal streaks in the displayed images.

Optionally, the display substrate further comprises a black matrix 1 disposed on the base substrate and surrounding each of the sub-pixels.

As another example, the white light-transmissive region is disposed in all of the first sub pixels 21, the second sub-pixels 22 and the third sub-pixels 23, which is not illustrated here. As still another example, the white light-transmissive region is disposed in all or part of the third sub-pixels 23, which is not illustrated here. As still another example, the white light-transmissive region is disposed in all or part of two of the first sub pixels 21, the second sub-pixels 22 and the third sub-pixels 23, which is not illustrated here. If the white light-transmissive regions are disposed in the second and third sub-pixels, the projections along the direction of pixel rows of the white light-transmissive regions disposed in adjacent the second and third sub-pixels do not overlap each other, preventing the white light-transmissive regions from forming continuous white light-transmissive regions along an arrangement direction of the sub-pixels, thereby preventing white horizontal streaks in the displayed images. In practical applications, quantities and locations of the white light-transmissive regions may be configured according to color scheme, so as to improving the transmittivity of the display substrate and the display quality of the displayed images, which will not be elaborated here.

During an actual display procedure, color gamut of individual red, green and blue sub-pixels with the white light-transmissive regions disposed therein is made wider by increasing or decreasing gray scale of sub-pixels, through processing original red brightness signal corresponding to the red sub-pixels, green brightness signal corresponding to the green sub-pixels and blue brightness signal corresponding to the blue brightness signal, such as appropriately increasing or decreasing a voltage signal applied to a sub-pixel according to the area ratio of the white light-transmissive region in the sub-pixel.

In the technical solution of the display substrate provided by the embodiment of the invention, the white light-transmissive region is disposed in at least one of the first sub-pixels, the second sub-pixels and the third sub-pixels, which effectively increases the transmittivity of the display substrate, thereby increasing the transmittivity of the display device. As the embodiment can increase the transmittivity of the display device, the luminance of the back light of the display device of the embodiment may be reduced, when the overall brightness of the display device is kept the same as that of known display devices.

Figure 4:
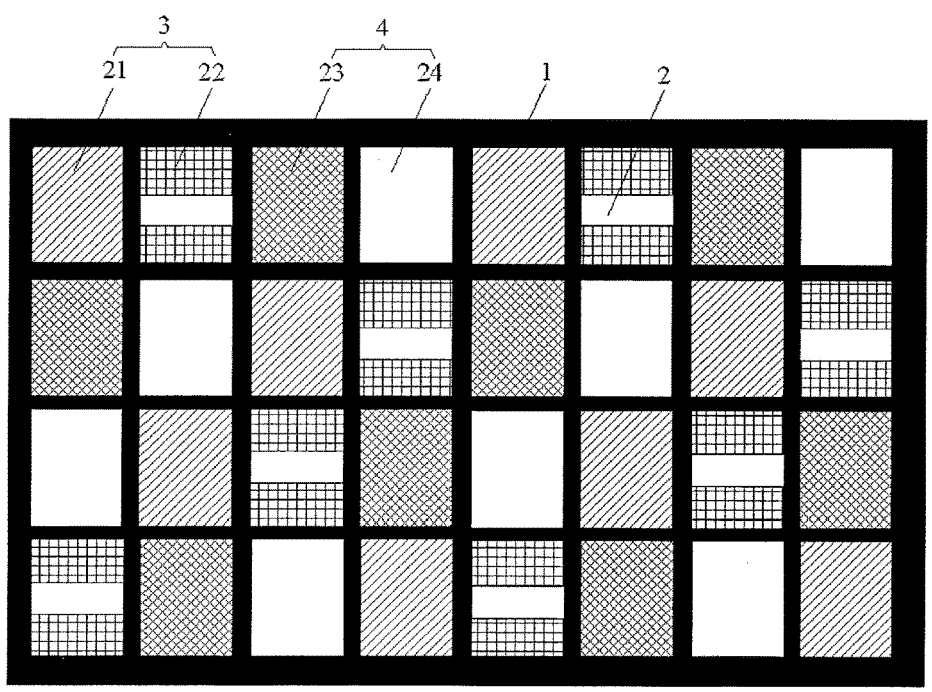
FIG. 4 schematically illustrates a configuration of a display substrate in accordance with a third embodiment of the invention.

FIG. 4 schematically illustrates a configuration of a display substrate provided by a third embodiment of the invention. As illustrated in FIG. 4, the embodiment differs from the second embodiment in that the white light-transmissive regions 2 are disposed in all of the second sub-pixels 22. For example, when the second sub-pixels 22 are blue sub-pixels, the white light-transmissive regions 2 are disposed in all of the blue sub-pixels. In the above implementation, each pixel element comprises a white sub-pixel or a white light-transmissive region, such that each pixel element comprises three color elements of red, green and blue, thereby improving the display effect of the displayed images. In the above implementation, the disposition of the white light-transmitting regions allows the white color to distribute more evenly, which helps to improve the transmittivity of the display substrate as well as the display effect of the displayed images, further optimizing the visual experience of the user.

In the technical solution of the display substrate provided by the embodiment of the invention, the white light-transmissive region is disposed in at least one of the first sub-pixels, the second sub-pixels and the third sub-pixels, which effectively increases the transmittivity of the display substrate, thereby increasing the transmittivity of the display device. As the embodiment can increase the transmittivity of the display device, the luminance of the back light of the display device of the embodiment may be reduced, when the overall brightness of the display device is kept the same as that of known display devices.

Figure 5:
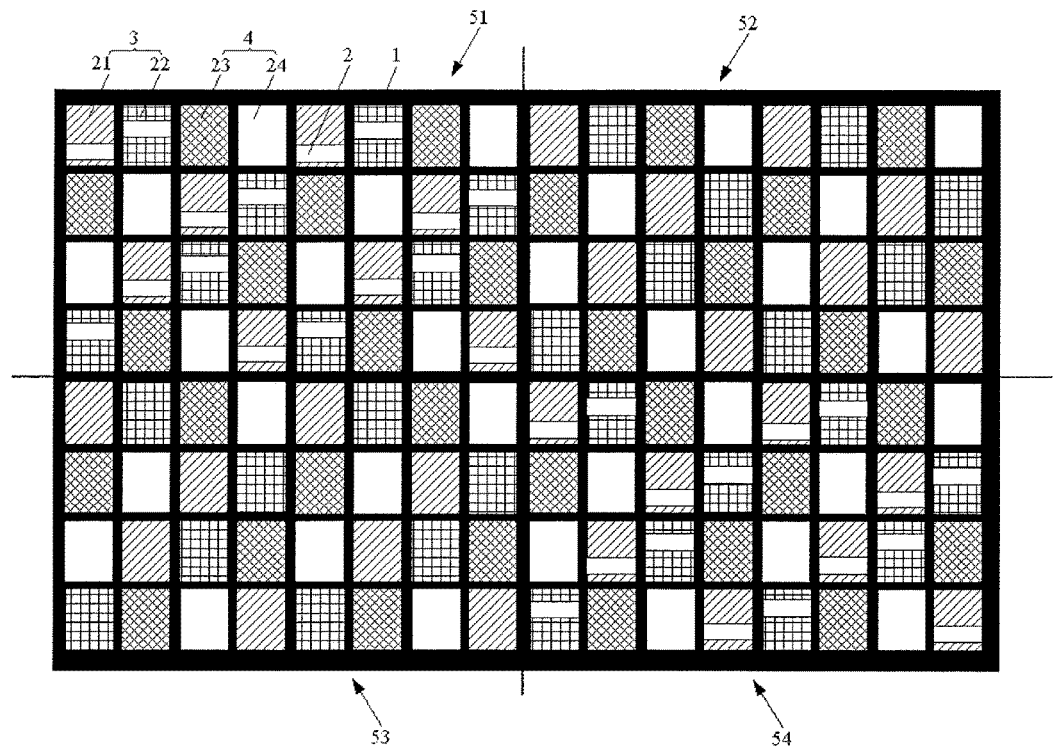
FIG. 5 schematically illustrates a configuration of a display substrate in accordance with a fourth embodiment of the invention.

FIG. 5 schematically illustrates a configuration of a display substrate provided by a fourth embodiment of the invention. As illustrated in FIG. 5, the embodiment differs from the second embodiment in that: in the embodiment, the display substrate comprises eight pixel sets arranged into a 2×4 matrix, wherein any two adjacent pixel sets form one region, and the white light-transmissive region is disposed in all of the first and second sub-pixels in two regions arranged along a diagonal line of the matrix. In an example as illustrated in FIG. 5, a region 51, a region 52, a region 53 and a region 54 are respectively formed by two pixel sets. The white light-transmissive region 2 is disposed in both the first sub-pixel 21 and the second sub-pixel 22 of the region 51, no white light-transmissive region is disposed in the region 52, no white light-transmissive region is disposed in the region 53, while the white light-transmissive region 2 is disposed in both the first sub-pixel 21 and the second sub-pixel 22 of the region 54. The region 51 disposed at the upper-left corner and having the white light-transmissive region 2 as well as the region 53 disposed at the lower-right corner and having the white light-transmissive region 2 are arranged along a diagonal line of the matrix. At the same time, the region 52 disposed at the upper-right corner without the white light-transmissive region 2 as well as the region 54 disposed at the lower-left corner without the white light-transmissive region 2 are arranged along another diagonal line of the matrix. The first sub-pixels 21 are red sub-pixels, and the second sub-pixels 22 are blue sub-pixels. In the above implementation, the disposition of the white light-transmitting regions allows the white color to distribute more evenly, which helps to improve the transmittivity of the display substrate as well as the display effect of the displayed images, further optimizing the visual experience of the user.

In the technical solution of the display substrate provided by the embodiment of the invention, the white light-transmissive region is disposed in at least one of the first sub-pixels, the second sub-pixels and the third sub-pixels, which effectively increases the transmittivity of the display substrate, thereby increasing the transmittivity of the display device. As the embodiment can increase the transmittivity of the display device, the luminance of the back light of the display device of the embodiment may be reduced, when the overall brightness of the display device is kept the same as that of known display devices.

Figure 6:
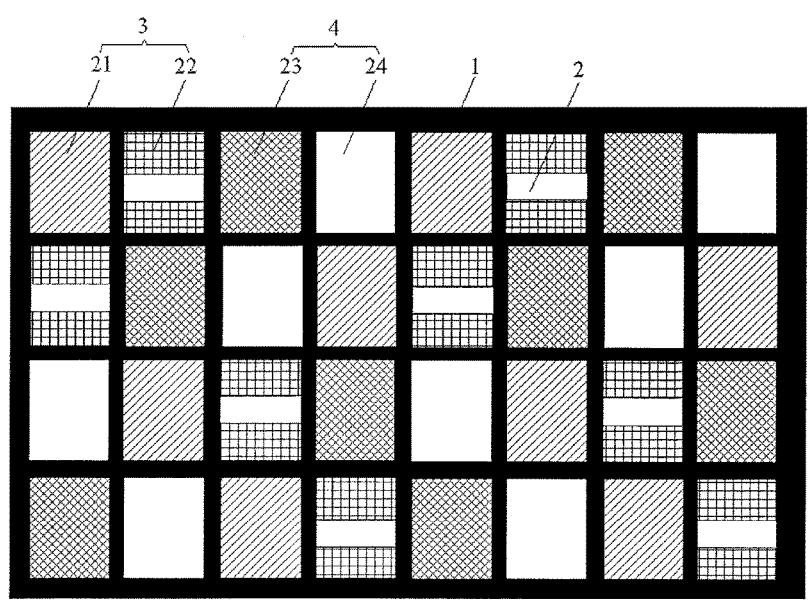
FIG. 6 schematically illustrates a configuration of a display substrate in accordance with a fifth embodiment of the invention.

FIG. 6 schematically illustrates a configuration of a display substrate provided by a fifth embodiment of the invention. As illustrated in FIG. 6, the display substrate comprises: a base substrate and a plurality of pixel sets disposed on the base substrate, each of the pixel sets comprising: four first sub-pixels 21, four second sub-pixels 22, four third sub-pixels 23 and four fourth sub-pixels 24, wherein sub-pixels of each of the pixel-sets are arranged into a 4×4 matrix. Among the four pixel rows of each of the pixel sets, the first sub-pixel 21, the second sub-pixel 22, the third sub-pixel 23 and the fourth sub-pixel 24 are sequentially arranged in one of the pixel rows, the second sub-pixel 22, the third sub-pixel 23, the fourth sub-pixel 24 and the first sub-pixel 21 are sequentially arranged in one of the pixel rows, the fourth sub-pixel 24, the first sub-pixel 21, the second sub-pixel 22 and the third sub-pixel 23 are sequentially arranged in one of the pixel rows, and the third sub-pixel 23, the fourth sub-pixel 24, the first sub-pixel 21 and the second sub-pixel 22 are sequentially arranged in one of the pixel rows.

In the embodiment, the sequentially arranged first sub-pixel 21, second sub-pixel 22, third sub-pixel 23 and fourth sub-pixel 24 are located in the first pixel row, the sequentially arranged second sub-pixel 22, third sub-pixel 23, fourth sub-pixel 24 and first sub-pixel 21 are located in the second pixel row, the sequentially arranged fourth sub-pixel 24, first sub-pixel 21, second sub-pixel 22, and third sub-pixel 23 are located in the third pixel row, and the sequentially arranged third sub-pixel 23, fourth sub-pixel 24, first sub-pixel 21 and second sub-pixel 22 are located in the fourth pixel row.

As an example, the first sub-pixel 21 is a red sub-pixel, the second sub-pixel 22 is a blue sub-pixel, the third sub-pixel 23 is a green sub-pixel, and the fourth sub-pixel 24 is a white sub-pixel. In each of the pixel sets, the red sub-pixel, the blue sub-pixel, the green sub-pixel and the white sub-pixel are sequentially arranged in the first pixel row, the blue sub-pixel, the green sub-pixel, the white sub-pixel and the red sub-pixel are sequentially arranged in the second pixel row, the white sub-pixel, the red sub-pixel, the blue sub-pixel and the green sub-pixel are sequentially arranged in the third pixel row, and the green sub-pixel, the white sub-pixel, the red sub-pixel and the blue sub-pixel are sequentially arranged in the fourth pixel row.

In each pixel row, the first sub-pixel 21, the second sub-pixel 22, the third sub-pixel 23 and the fourth sub-pixel 24 form a pixel element, or any two of the sub-pixels form a pixel element. In the embodiment, two sub-pixels of the first sub-pixel 21, the second sub-pixel 22, the third sub-pixel 23 and the fourth sub-pixel 24 of each pixel row form a pixel element. If the first sub-pixel 21 is a red sub-pixel the second sub-pixel 22 is a blue sub-pixel, the third sub-pixel 23 is a green sub-pixel and the fourth sub-pixel 24 is a white sub-pixel, a pixel element 3 in the first pixel row comprises sequentially arranged red sub-pixel and blue sub-pixel, a pixel element 4 in the first pixel row comprises sequentially arranged green sub-pixel and white sub-pixel, a pixel element 3 in the second pixel row comprises sequentially arranged blue sub-pixel and green sub-pixel, a pixel element 4 in the second pixel row comprises sequentially arranged white sub-pixel and red sub-pixel, a pixel element 3 in the third pixel row comprises sequentially arranged white sub-pixel and red sub-pixel, a pixel element 4 in the third pixel row comprises sequentially arranged blue pixel and green pixel, a pixel element 3 in the fourth pixel row comprises sequentially arranged green sub-pixel and white sub-pixel, and a pixel element 4 in the fourth pixel row comprises sequentially arranged red sub-pixel and blue sub-pixel.

Optionally, the white light-transmissive region 2 is disposed in at least one of the first sub-pixel 21, the second sub-pixel 22 and the third sub-pixel 23.

In the embodiment, the white light-transmissive region 2 is disposed in all of the second sub-pixels 22. Herein, the second sub-pixels 22 are blue sub-pixels. Therefore, the white light-transmissive region 2 is disposed in all of the blue sub-pixels. In the above implementation, each pixel element comprises a white sub-pixel or a white light-transmissive region, such that each pixel element comprises three color elements of red, green and blue, which helps to improve the display effect of the displayed images. In the above example, the disposition of the white light-transmissive region(s) allows the white color to distribute more evenly, which helps to improve the transmittivity of the display substrate as well as the display effect of the displayed images, further optimizing the visual experience of the user.

In the embodiment, the white light-transmissive region 2 is a strip-shaped region disposed along the direction of pixel rows. A size of the white light-transmissive region 2 may be configured as required. As an example, a length of the white light-transmissive region 2 along a direction vertical to the direction of pixel rows is smaller or equal to one-third of a length of the color sub-pixels and larger than 0.

In the embodiment, the white light-transmissive region 2 disposed in the second sub-pixel 22 is a void space in a color filter layer of the second sub-pixel 22.

Optionally, the display substrate further comprises a black matrix 1 disposed on the base substrate and surrounding each of the sub-pixels.

In practical applications, the white light-transmissive region 2 may also be disposed according to the above embodiments 2, 3 or 4, which will not be elaborated here.

In the technical solution of the display substrate provided by the embodiment of the invention, the white light-transmissive region is disposed in at least one of the first sub-pixel, the second sub-pixel and the third sub-pixel, which effectively increases the transmittivity of the display substrate, thereby increasing the transmittivity of the display device. As the embodiment can increase the transmittivity of the display device, the luminance of the back light of the display device of the embodiment may be reduced, when the overall brightness of the display device is kept the same as that of known display devices.

Figure 7:
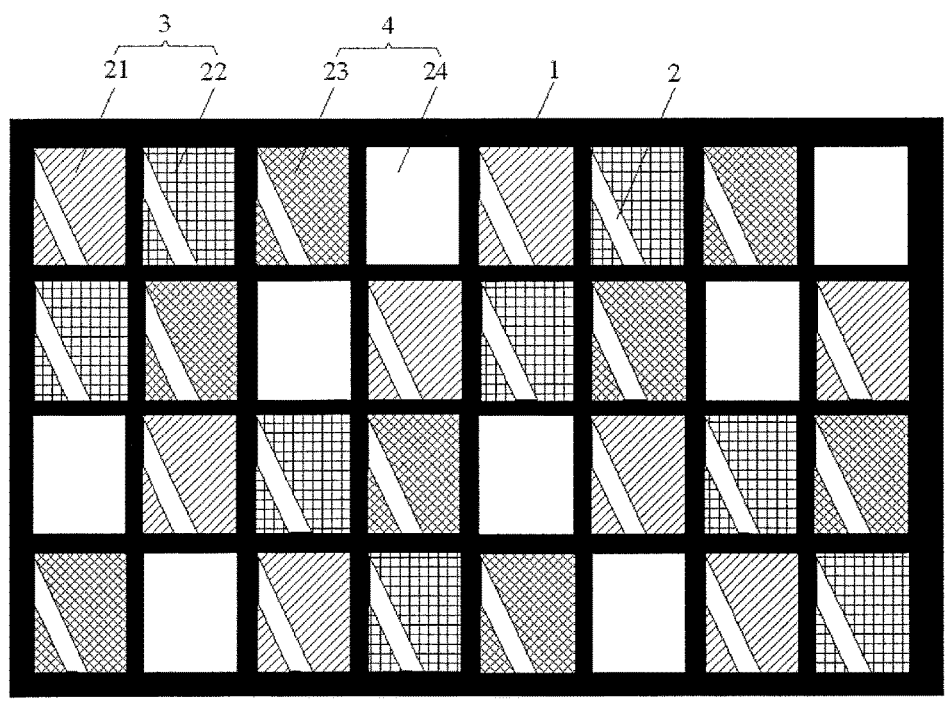
FIG. 7 schematically illustrates a configuration of a display substrate in accordance with a sixth embodiment of the invention.

FIG. 7 schematically illustrates a configuration of a display substrate provided by a sixth embodiment of the invention. As illustrated in FIG. 7, the embodiment differs from the fifth embodiment in that the white light-transmissive region 2 is disposed in all of the first sub-pixels 21, the second sub-pixels 22 and the third sub pixels 23. Herein, the first sub pixels 21 are red sub-pixels, the second sub-pixels 22 are blue sub-pixels, the third sub-pixels 23 are green sub-pixels; therefore, the white light-transmissive region 2 is disposed in all of the red, blue and green sub-pixels. In the above implementation, each pixel element comprises a white sub-pixel or a white light-transmitting region, such that each pixel element comprises three color elements of red, green and blue, thereby improving the display effect of the displayed images. In the above implementation, the disposition of the white light-transmitting regions allows the white color to distribute more evenly, which helps to improve the transmittivity of the display substrate as well as the display effect of the displayed images, further optimizing the visual experience of the user.

In the embodiment, the white light-transmissive region 2 is a strip-shaped region obliquely disposed with respect to a direction of pixel rows, which can effectively prevent the white light-transmissive regions from forming continuous white light-transmissive regions, thereby preventing white lines in the displayed images.

The seventh embodiment provides a display device, which comprises any of the display substrate from the first embodiment to the sixth embodiment.

As an example, the display device further comprises an opposed substrate disposed opposed to the display substrate.

As an example, the display device further comprises a liquid crystal layer disposed between the display substrate and the opposed substrate.

As an example, the display substrate is a color filter substrate and the opposed substrate is an array substrate.

As an example, the display substrate is a Color Filter on Array (COA) substrate, and the opposed substrate is a glass substrate.

Optionally, the display substrate is a COA substrate. In the COA substrate, a black matrix, red sub-pixels, green sub-pixels, blue sub-pixels and white sub-pixels are formed on a front side of the base substrate, while individual structures of known array substrate are formed on a back side of the base substrate. That is, the COA substrate is formed by disposing the original color filter substrate and array substrate on the front and back side of the base substrate; and the opposed substrate is a glass substrate.

In the implementation of the display device provided by the embodiment of the invention, a plurality of pixel sets are disposed on the base substrate, each of the pixel sets comprises: four first sub-pixels, four second sub-pixels, four third sub-pixels and four fourth sub-pixels, among four pixel rows of each of the pixel sets, the first sub-pixel, the second sub-pixel, the third sub-pixel and the fourth sub-pixel are sequentially arranged according to different orders, such that individual sub-pixels are evenly distributed, preventing the same sub-pixels from being located in the same column, thereby preventing serious white streaks from presenting in gray-scale pictures of the display device, thus improving the display quality of the displayed images. At least one white light-transmissive region is disposed in at least one of the first sub-pixel, the second sub-pixel and the third sub-pixel, which effectively improves the transmittivity of the display substrate, thereby improving the transmittivity of the display device. As the embodiment may improve the transmittivity of the display device, therefore the luminance of the back light of the display device of the embodiment may be reduced, when the overall brightness of the display device is kept the same as that of known display devices.

The eighth embodiment of the invention provides a method for fabricating a display substrate, comprising:

Step 101: forming a plurality of pixel sets on a base substrate, wherein each of the pixel sets comprises: four first sub-pixels, four second sub-pixels, four third sub-pixels and four fourth sub-pixels, sub-pixels of each of the pixel-sets are arranged into a 4×4 matrix; among four pixel rows of each of the pixel sets, the first sub-pixel, the second sub-pixel, the third sub-pixel and the fourth sub-pixel are sequentially arranged in one of the pixel rows, the second sub-pixel, the third sub-pixel, the fourth sub-pixel and the first sub-pixel are sequentially arranged in one of the pixel rows, the fourth sub-pixel, the first sub-pixel, the second sub-pixel and the third sub-pixel are sequentially arranged in one of the pixel rows, and the third sub-pixel, the fourth sub-pixel, the first sub-pixel and the second sub-pixel are sequentially arranged in one of the pixel rows.

Optionally, a white light-transmissive region is disposed in at least one of the first sub-pixel, the second sub-pixel and the third sub-pixel.

Step 101 comprises for example:

Step 1011: forming the first sub-pixels on the base substrate through a patterning process.

Step 1012: forming the second sub-pixels on the base substrate through a patterning process.

Step 1013: forming the third sub-pixels on the base substrate through a patterning process.

Step 1014: forming the fourth sub-pixels on the base substrate through a patterning process.

Sequence for performing steps 1011 to 1014 may be modified as necessary.

As an example, the method further comprises:

Step 102: forming a black matrix surrounding each of the sub-pixels on the base substrate.

As an example, the black matrix surrounding each of the sub-pixels on the base substrate may be formed on the base substrate through a patterning process. Sequence for performing steps 101 to 102 may be modified as necessary.

In the embodiment, the patterning process may comprise: photoresist application, exposure, developing, etching, and photoresist peeling and so on.

The method for fabricating a display substrate provided by the embodiment of the invention may be used for fabricating any of the display substrates from the first embodiment to the sixth embodiment. For detailed descriptions of the display substrates please refer to the description from the first embodiment to the sixth embodiment.

In the display substrate fabricated according to the method for fabricating a display substrate provided by the embodiment of the invention, a plurality of pixel sets are formed on a base substrate, each of the pixel sets comprises: four first sub-pixels, four second sub-pixels, four third sub-pixels and four fourth sub-pixels, among four pixel rows of each of the pixel sets, the first sub-pixel, the second sub-pixel, the third sub-pixel and the fourth sub-pixel are sequentially arranged according to different orders, such that individual sub-pixels are evenly distributed, preventing the same sub-pixels from being located in the same column, thereby preventing serious white streaks from presenting in gray-scale pictures of the display device, thus improving the display quality of the displayed images. At least one white light-transmissive region is disposed in at least one of the first sub-pixel, the second sub-pixel and the third sub-pixel, which effectively improves the transmittivity of the display substrate, thereby improving the transmittivity of the display device. As the embodiment may improve the transmittivity of the display device, therefore the luminance of the back light of the display device of the embodiment may be reduced, when the overall brightness of the display device is kept the same as that of known display devices.

What is described above is related to the illustrative embodiments of the disclosure only and not limitative to the scope of the disclosure; the scopes of the disclosure are defined by the accompanying claims.

This application claims the priority of Chinese Application No. 201410043962.5, filed on Jan. 29, 2014, and which application is incorporated herein by reference.

What is claimed is:

1. A display substrate, comprising: a base substrate and a plurality of pixel sets disposed on the base substrate, each of the pixel sets comprising:

four first sub-pixels, four second sub-pixels, four third sub-pixels and four fourth sub-pixels, wherein sub-pixels of each of the pixel-sets are arranged into a 4×4 matrix;

among four pixel rows of each of the pixel sets, a first sub-pixel, a second sub-pixel, a third sub-pixel and a fourth sub-pixel are sequentially arranged in one of the pixel rows, a second sub-pixel, a third sub-pixel, a fourth sub-pixel and a first sub-pixel are sequentially arranged in one of the pixel rows, a fourth sub-pixel, a first sub-pixel, a second sub-pixel and a third sub-pixel are sequentially arranged in one of the pixel rows, and a third sub-pixel, a fourth sub-pixel, a first sub-pixel and a second sub-pixel are sequentially arranged in one of the pixel rows;

wherein a white light-transmissive region is disposed in two of each of the first, second, and third sub-pixels.

2. The display substrate of claim 1, wherein the sequentially arranged first sub-pixel, second sub-pixel, third sub-pixel and fourth sub-pixel are located in a first pixel row, the sequentially arranged second sub-pixel, third sub-pixel, fourth stab-pixel and first sub-pixel are located in a second pixel row, the sequentially arranged fourth sub-pixel, first sub-pixel, second sub-pixel, and third sub-pixel are located in a third pixel row, and the sequentially arranged third sub-pixel, fourth sub-pixel, first sub-pixel and second sub-pixel are located in a fourth pixel row; or the sequentially arranged first sub-pixel, second sub-pixel, third sub-pixel and fourth sub-pixel are located in a first pixel row, the sequentially arranged third sub-pixel, fourth sub-pixel, first sub-pixel and second sub-pixel are located in a second pixel row, the sequentially arranged fourth sub-pixel, first sub-pixel, second sub-pixel, and third sub-pixel are located in a third pixel row, and the sequentially arranged second sub-pixel, third sub-pixel, fourth sub-pixel and first sub-pixel are located in a fourth pixel row.

3. The display substrate of claim 2, comprising eight pixel sets arranged into a 2×4 matrix, wherein two adjacent pixel sets form one region, and a white light-transmissive region is disposed in all of the first and second sub-pixels in two regions arranged along a diagonal line of the matrix.

4. The display substrate of claim 1, wherein the white light-transmissive region is disposed in all of the first and second sub-pixels.

5. The display substrate of claim 1, wherein the white light-transmissive region is disposed in the first and second sub-pixels, and projections along a direction of pixel rows of the white light-transmissive regions disposed in adjacent first and second sub-pixels do not overlap each other.

6. The display substrate of claim 1, wherein the white light-transmissive region is disposed in the second and third sub-pixels, and projections along a direction of pixel rows of the white light-transmissive regions disposed in adjacent second and third sub-pixels do not overlap each other.

7. The display substrate of claim 1, wherein the white light-transmissive region is a strip-shaped region obliquely disposed with respect to a direction of pixel rows.

8. The display substrate of claim 1, wherein the white light-transmissive region is a strip-shaped region disposed parallel to a direction of pixel rows.

9. The display substrate of claim 8, wherein a length of the white light-transmissive region along the direction of pixel rows is larger than 0 and smaller or equal to one-third of a length of the sub-pixel along the direction of pixel rows.

10. The display substrate of claim 1, wherein the first sub-pixels are red sub-pixels, the second sub-pixels are blue sub-pixels, the third sub-pixels are green sub-pixels, and the fourth sub-pixels are white sub-pixels.

11. A display device, comprising the display substrate of claim 1.

12. The display device of claim 11, further comprising an opposed substrate, wherein the display substrate is a color filter substrate and the opposed substrate is an array substrate.

13. A method for fabricating a display substrate, comprising:
   forming a plurality of pixel sets on a base substrate, wherein each of the pixel sets comprises:
   four first sub-pixels, four second sub-pixels, four third sub-pixels and four fourth sub-pixels, sub-pixels of each of the pixel-sets are arranged into a 4×4 matrix; among four pixel rows of each of the pixel sets, one of the pixel rows a second sub-pixel, a third sub-pixel, a fourth sub-pixel and a first sub-pixel are sequentially arranged in one of the pixel rows, a fourth sub-pixel, a first sub-pixel, a second sub-pixel and a third sub-pixel are sequentially arranged in one of the pixel rows, and a third sub-pixel, a fourth subpixel, a first sub-pixel and a second sub-pixel are sequentially arranged in one of the pixel rows;
   and forming a white light transmissive region in two of each of the first second and third sub-pixels.

14. The method of claim 13, wherein the white light-transmissive region is a strip-shaped region obliquely disposed with respect to a direction of pixel rows.

15. The method of claim 13, wherein the white light-transmissive region is a strip-shaped region disposed parallel to a direction of pixel rows.

16. The method of claim 13, wherein the first sub-pixel is a red sub-pixel, the second sub-pixel is a blue sub-pixel, the third sub-pixel is a green sub-pixel, and the fourth sub-pixel is a white sub-pixel.

17. The method of claim 13, further comprising: forming a black matrix surrounding each of the sub-pixels on the base substrate.

18. A display substrate, comprising: a base substrate and a plurality of pixel sets disposed on the base substrate, each of the pixel sets comprising:
   four first sub-pixels, four second sub-pixels, four third sub-pixels and four fourth sub-pixels, wherein sub-pixels of each of the pixel-sets are arranged into a 4×4 matrix;
   among four pixel rows of each of the pixel sets, a first sub-pixel, a second sub-pixel, a third sub-pixel and a fourth sub-pixel are sequentially arranged in one of the pixel rows, a second sub-pixel, a third sub-pixel, a fourth sub-pixel and a first sub-pixel are sequentially arranged in one of the pixel rows, a fourth sub-pixel, a first sub-pixel, a second sub-pixel and a third sub-pixel are sequentially arranged in one of the pixel rows, and a third sub-pixel, a fourth sub-pixel, a first sub-pixel and a second sub-pixel are sequentially arranged in one of the pixel rows;
   wherein a white light-transmissive region is disposed in one of each of the first, second and third sub-pixels.

19. The display substrate of claim 18, wherein the white light transmissive region is disposed in all of second sub-pixels.

* * * * *